United States Patent [19]

Thomas

[11] 3,862,426

[45] Jan. 21, 1975

[54] ELECTRONICALLY CONTROLLED SPOT FILM DEVICE

[75] Inventor: Eugene P. Thomas, Baltimore, Md.

[73] Assignee: CGR Medical Corporation, Baltimore, Md.

[22] Filed: Nov. 21, 1973

[21] Appl. No.: 418,115

[52] U.S. Cl. .................. 250/402, 250/416, 250/471

[51] Int. Cl. .......................................... G03b 41/16

[58] Field of Search ........... 250/468, 470, 471, 416, 250/402

[56] References Cited

UNITED STATES PATENTS 2,890,346 6/1959 Kizaur ................................ 250/471

2,974,228 3/1961 Berger ................................ 250/470

*Primary Examiner*—James W. Lawrence
*Assistant Examiner*—C. E. Church
*Attorney, Agent, or Firm*—Brady, O'Boyle & Gates

[57] ABSTRACT

An electronically controlled spot film device for a diagnostic X-ray system, utilizing solid state digital logic circuit means providing electrical output signals generated in accordance with binary logic which are used to control the motion and position of an X-ray film cassette, the radiographic grid position, the selection of correct mask combination, X-ray generator operation and an exposure indicator of the exposed X-ray film areas.

13 Claims, 20 Drawing Figures

SEQUENCE SIG GEN

FIG. 6 SEQUENCE COUNTER

CASSETTE POSITION SEQUENCE LOGIC

CASSETTE DRIVE

DUAL SPEED
AIR CONTROL

ELECTRONICALLY CONTROLLED SPOT FILM DEVICE

BACKGROUND OF THE INVENTION

1. Field of the Invention

This invention relates generally to spot film devices utilized in X-ray machines, and more particularly to an electronically controlled X-ray cassette positioning system utilizing digital logic programming means for controlling, inter alia, the actuation of pneumatic actuators and positioning stops in response to the operation of positioning sensing means and control push-buttons whereby the required complex mechanical motion involved in making a series of radiographic exposures are reduced to their simple orthogonal components.

2. Description of the Prior Art

In order to obtain a series of radiographic exposures in rapid succession, it is common practice to provide some type of an arrangement for rapidly shifting the film cassette in the spot film housing to a position in alignment with the X-ray beam. Such devices are generally well known to those skilled in the art. The cassette shifting mechanism heretofore ordinarily included a carriage which is mounted on rollers and travels on a pair of tracks or the like within the spot film device to carry the cassette from an idle or "park" position to one or more selected radiographic positions. In order to expose the four quadrants of a rectangular film successively, the cassette carrying mechanism must first be shiftable to align a first quadrant with the X-ray beam. The carriage must then be shifted to the park position during further observation, and must be immediately ready when in said park position, to be shifted to a second active position to align a second quadrant of the film in the exact location previously occupied by the first quadrant. After radiographic exposure of the second quadrant, the cassette shifting mechanism is again operated through the same cycle except that the cassette is laterally shifted relative to the carriage to permit the laterally adjacent third and fourth quadrants to be successively positioned in alignment with the X-ray beam for exposures.

While U.S. Pat. No. 2,892,090, Koerner, and U.S. Pat. No. 2,817,766, Leishman, typically illustrate manually operated spot film devices wherein mechanical linkages position the cassette in the field of the X-ray beam, U.S. Pat. No. 3,173,011, Barrett et al., discloses, for example, a spot film device powered by an electric motor. A still third type of spot film device is known wherein pneumatic cassette positioning means are utilized. Such apparatus is disclosed, for example, in U.S. Pat. Nos. 3,307,037, E.P. Thomas; 3,524,059, Bartlett; and 3,740,556, Otto, Jr.

SUMMARY

The present invention is directed to an improved pneumatically powered spot film device which is electronically controlled by solid state digital logic circuitry which interfaces with electrically operated solenoid air valves which operate penumatic actuators for controlling the cassette motion and position as well as operating positioning stops in response to operator initiated selector switches whereby the mechanical motion of the cassette is reduced to simple orthogonal movement thereby minimizing the undesirable mechanical interactions such as being trapped on the wrong side of a pin stop or getting out of sequence. Additionally, the digital logic circuitry also produces outputs which control the radiographic grid position, the selection of correct mask combination, X-ray exposure initiation and activates an analog read out or display of exposed film areas. Operator actuated push-buttons initiate binary digital logic circuitry for automatically programming a LOAD sequence, a 1-on-1, 2-on-1 (longitudinal and transverse), 4-on-1 sequence, a RAPID sequence which eliminates the park position between exposures while performing a 4-on-1 or 2-on-1 exposure sequentially and an exposure SKIP sequence which permits more complex formatting.

DESCRIPTION OF THE PREFERRED EMBODIMENT

Figure 1A:
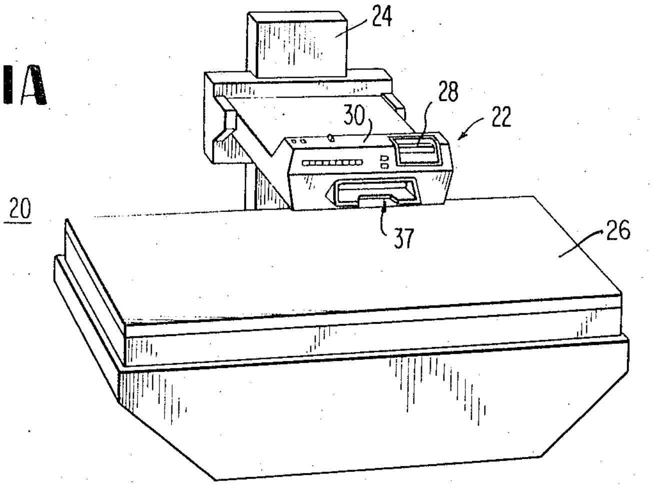
FIG. 1A is a perspective view generally illustrative of a radiographic-fluoroscopic diagnostic X-ray system including the subject spot film device mounted on a spot film tower.

Referring now to the drawings wherein like reference numerals refer to same parts throughout, attention is first directed to FIG. 1 wherein reference numeral 20 designates a diagnostic X-ray unit having the spot film device 22 according to the subject invention mounted on a spot film tower 24. The spot film device is adapted for three degrees of movement over the top of X-ray table 26 in accordance with a power assist system actuated by a manually gripped control handle 28 located on the spot film control panel 30 at the front portion of the spot film device. A pneumatically powered system adapted to provide the power assist function is for example taught in U.S. Pat. No. 3,707,630, entitled "Pneumatic Power Assist System for Radiological or Similar Apparatus" which issued on Dec. 26, 1972, to Harry E. Koerner and William C. Horsey which invention is also assigned to the present assignee.

Figure 1B:
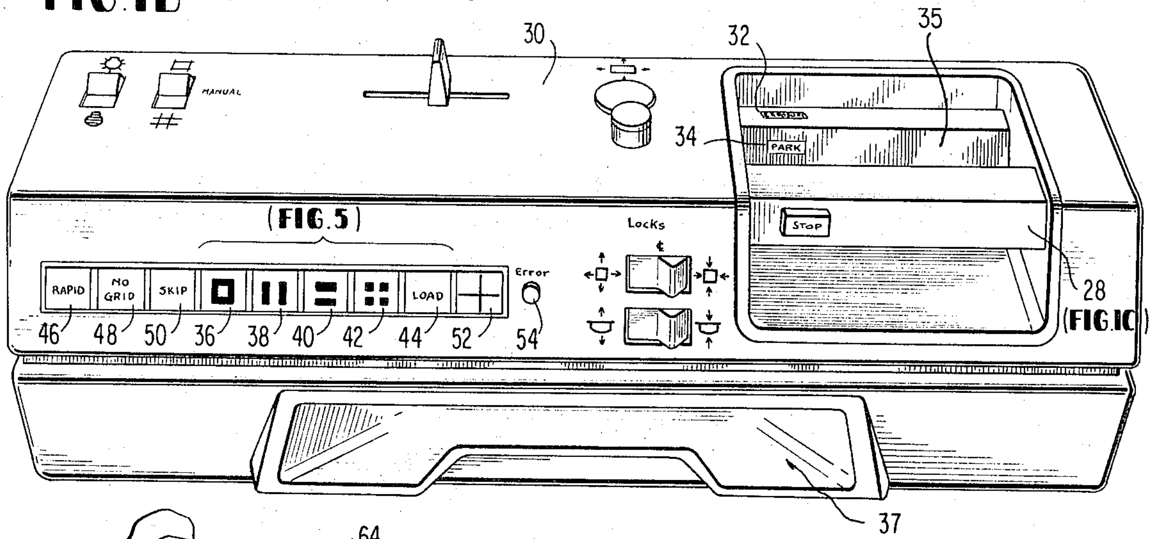
FIG. 1B is a front elevational view of the control panel located at the front of the spot film device comprising the subject invention.

Directing attention now to FIG. 1B which provides a better view of the spot film control panel 30, in addition to the power assist handle 28 located to one side thereof, there additionally includes behind the handle 28 a manually depressable X-ray exposure switch 32 as well as cassette ADVANCE and PARK position switches 33 and 34. The switches 32 and 34 are selectively positioned behind the handle 28 so as to be actuated by a pivoted rocker bar assembly 35 depressed by the operator without requiring the removal of his hand from the handle 28.

As is well known, a spot film device manipulates an X-ray film cassette through a number of relatively complicated sequences of motion to expose separate areas of radiographic film. Accordingly a film cassette, not shown, containing the radiographic film is inserted and retrieved from the spot film device from a front loading aperture 37 located at the forward end of the spot film device 22 beneath the control panel 30. The forward end of the spot film device adjacent the loading aperture 37 is defined as the LOAD position of the X-ray cassette while the rearward most or back longitudinal position in the spot film device is known as the PARK position. The LOAD and PARK positions, moreover, are in a line across the width of top of the table 26 shown in FIG. 1A. In addition to the PARK and LOAD positions, the cassette is also adapted to be positioned longitudinally in three intermediate positions defined as the SHORT, MEDIUM, and LONG positions wherein one quarter, one half and three quarters of the width of the cassette film is respectively extended into the X-ray field for an exposure. The cassette is also adapted to have three transverse or "cross shift" positions within the spot film device 22 and being identified as the HEAD, CENTER, and FOOT positions which lie in a line along the length of the table top 26. The HEAD position for example refers to the patient's head location while lying on the X-ray table 20, while the FOOT position naturally refers to the other end of the table.

Exclusive of the PARK and LOAD positions, the combination of the above noted cassette positions is thus adapted to provide a single 1-on-1 exposure by the depression of push-button switch 36, located on the front panel 30, two exposures on the film i.e. a 2-on-1(C) exposure with the short dimension parallel to the table top center line selectable by push-button switch 38, a second type of two exposures on the film i.e. a 2-on-1(L) with the long dimension of the exposed area parallel to the center line of the table top selectable by means of push-button switch 40, and four exposures on the film i.e. a 4-on-1 film sequence selectable by push-button switch 42. The push-button switches 36, 38, 40 and 42 are located in a line together with a LOAD push-button switch 44 which is depressed when it is desired to move the cassette to the LOAD position, a RAPID push-button switch 46 for providing a rapid filming sequence, a NO GRID push-button 48 for actuation of means for removing a radiographic oscillating grid from between the cassette tray and the patient, and a SKIP push-button switch 50 which is designed to permit the operator to by-pass an exposure on the film when desirable. An exposure indicator lamp assembly 52 as well as an error indicator light 54 are also located on the front panel for providing an indication of the portion of the cassette film previously exposed and an error situation occuring in the event that one attempts to re-expose a previously exposed portion of the film.

Figure 1C:
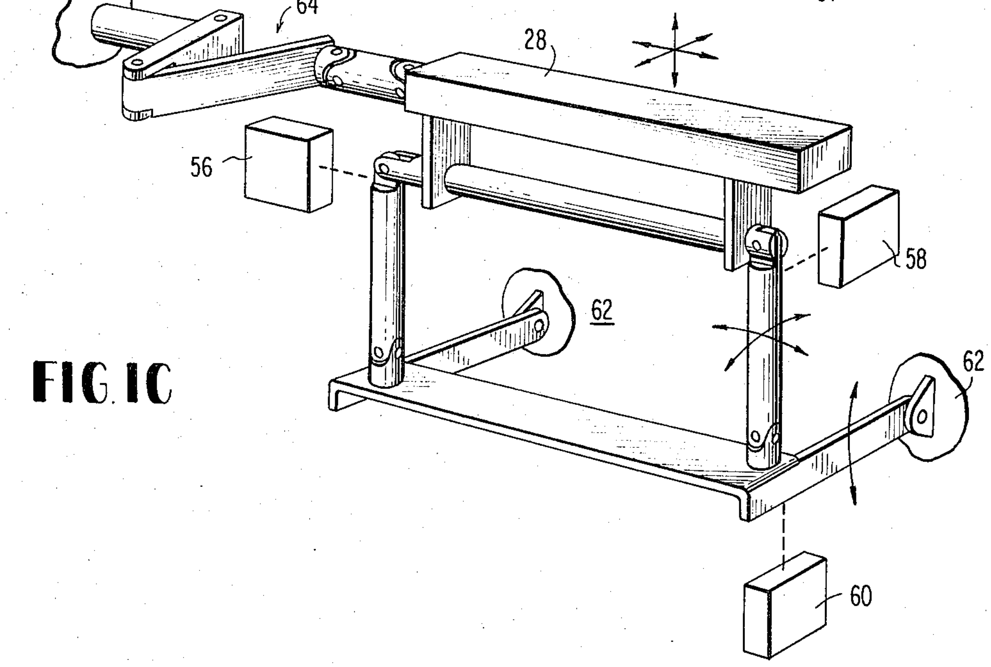
FIG. 1C is a mechanical schematic diagram illustrative of the control handle used for positioning the film device over the top of the X-ray table shown in FIG. 1A by power drive means.

While not specifically directed to the subject invention, the power assist handle linkage is nevertheless disclosed in FIG. 1C for purposes of indicating how one would position the spot film device 22 over the X-ray table 26 and since it appears as an integral part of the control panel 30. The handle 28 is coupled to three spool valves 56, 58 and 60 by a linkage generally designated by reference numeral 62 which is adapted to move in each of the three main table axes, separately and/or simultaneously, but is restrained so as to be parallel to the longitudinal axis of the table at all times. The longitudinal, cross and vertical motion components applied by manual force on the handle 28 are detected by the spool valves 56, 58 and 60, respectively, for controlling power assist valves which are adapted to actuate respective pneumatic driver pistons which operate to position the entire spot film device relative to the X-ray table top 26. Also, coupled to the handle 28 is an anti-rotation mechanism 64 which is adapted to prevent inappropriate response to wrist torque of the operator while gripping the handle 28.

Figure 2A:
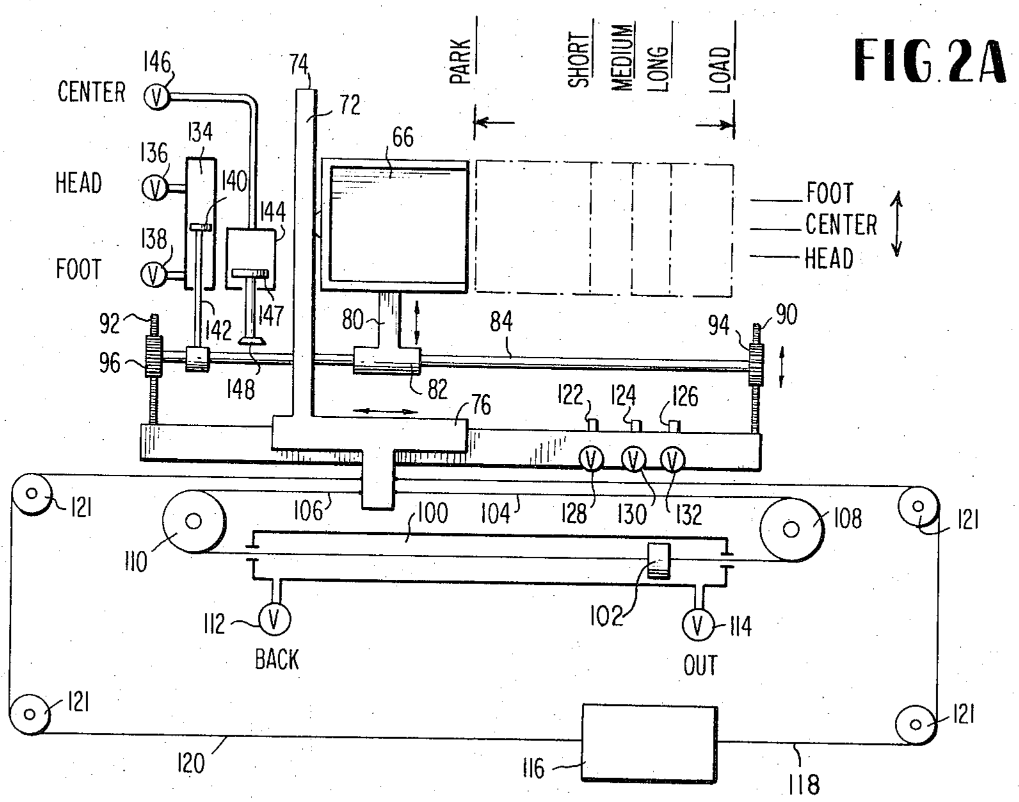
FIG. 2A is a mechanical diagram illustrative of the pneumatically driven cassette positioning means contemplated by the subject invention.
Figure 2B:
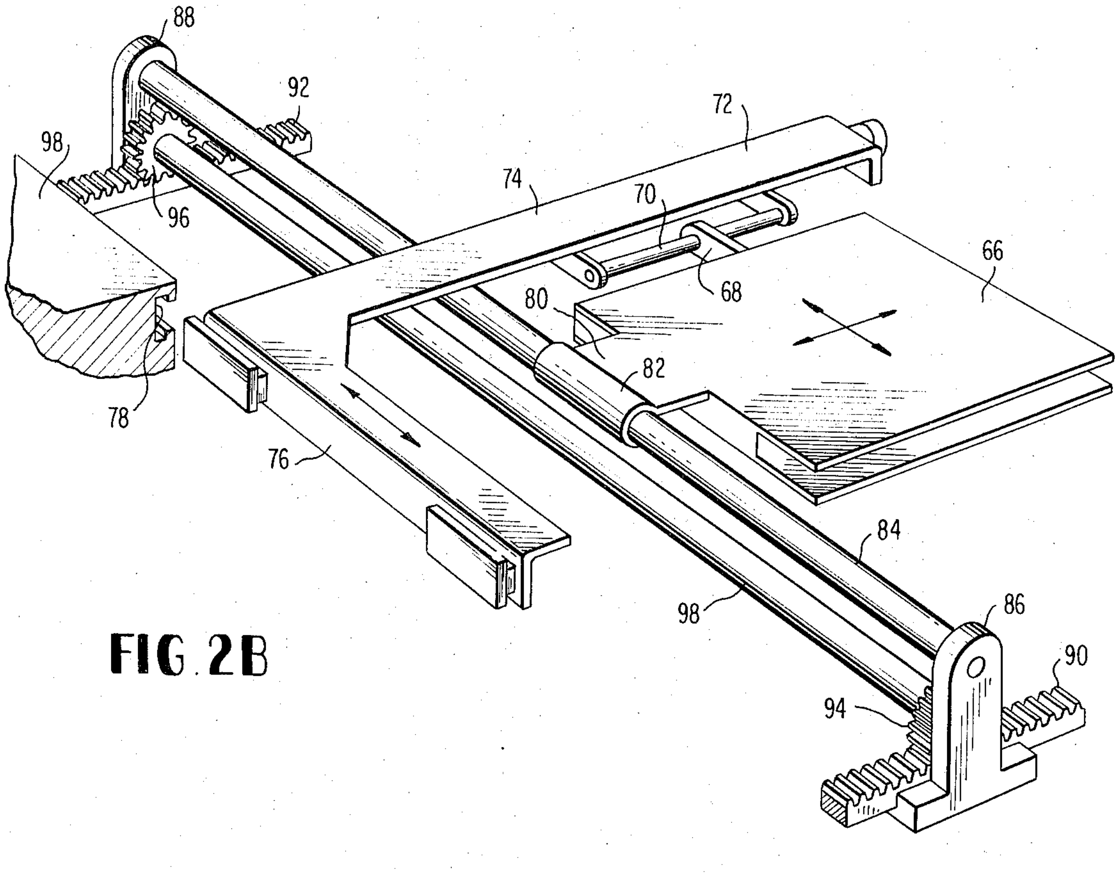
FIG. 2B is a perspective view further illustrative of the cassette positioning means for providing transverse (cross shift) motion of the cassette relative to the longitudinal axis of the housing of the spot film device.

Considering now the cassette positioning mechanism located inside of the spot film device 22, reference is now made to FIGS. 2A and 2B. A cassette tray 66 which is adapted to grasp and hold an X-ray film cassette, not shown, when inserted into the loading aperture 37 and then carry it to selected exposure positions within the spot film housing additionally includes a projection member 68 (FIG. 28) which slidably engages a rod member 70 projecting from but fixedly attached to the transverse arm portion 72 of a cassette carriage 74 which is adapted to travel in a longitudinal direction within the spot film device 22. The longitudinal body portion 76 of the carriage 74 is adapted to freely ride in longitudinally extending guide means 78. The cassette tray 66 also includes a second projecting member 80 orthogonal to the member 68 and terminates in a sleeve 82 which slidably engages a cross shift guide rod 84. The guide rod 84 has its extremities attached to a pair of end plates 86 and 88 which slide beneath a pair of parallely aligned gear racks 90 and 92. The two gear racks 90 and 92 are mated with respective pinion gears 94 and 96 which are coupled together by a second connecting rod 98 which also attaches to the end plates 86 and 88. Thus the cassette tray 66 is adapted to move both longitudinally by motion of the carriage 74 as well as in a cross-shift direction orthogonal to the longitudinal direction by means of the travel of the guide rods 84 and 98 provided by the rack and pinion gear combination.

Longitudinal motion of the carriage 74 is provided by a pneumatic cylinder 100 whose piston 102 is coupled to a flexible piston rod assembly in the form of a pair of flexible cables 104 and 106, which are attached to the body portion 76 after passing around a pair of idler wheels 108 and 110. Movement of the piston 102 in either direction is effected by selectively applying pneumatic fluid to one side of the piston 102 by electrically applying electric control signals to solenoid actuated control valves 112 and 114. Thus by operating the control valve 112, the cylinder 102 would be caused to drive the cassette rearwardly to the PARK position, while operation of the control valve 114 would cause the piston 102 to move in the opposite direction, causing the carriage 74 to move to the LOAD position. To prevent cassette inertia from jarring or vibrating the apparatus, a counterweight (counter-mass) 116 is coupled to the carriage body portion 76 by means of a pair of cables 118 and 120 moving over four idler wheels 121 shown in FIG. 2A so as to move with equal speed in the opposite direction in response to longitudinal movement of the carriage 74. Thus the center of mass of the assembly does not shift longitudinally when the cassette moves.

As noted above, five cassette locations are provided in the longitudinal direction. The PARK and LOAD positions are provided by the travel limits of the piston 102 in the pneumatic cylinder 100. The three intermediate SHORT, MEDIUM and LONG positions, however, are provided by pneumatically actuated carriage stops comprising electrically actuated solenoid actuated pistons 122, 124 and 126, respectively, arranged along the path of longitudinal travel of the carriage 74 and being electrically actuated such as by solenoid actuated valves 128, 130 and 132, respectively.

Also as noted above, three transverse or cross shift positions, HEAD, CENTER and FOOT are also desired. This motion is provided by a second double acting pneumatic drive cylinder 134 having electrically operated solenoid actuated valves 136 and 138 coupled thereto for moving a piston 140 connected to a piston rod 142 which is coupled to the cross shift guide rod 84. Thus the HEAD end and FOOT end positions are determined by the limits of the piston travel 140. The CENTER position on the other hand is provided by a third electrically operated pneumatic cylinder 144 having an electrically controlled pneumatic valve 146 and a piston 147 which is coupled to at a rod 148 which acts as a stop. The CENTER position is achieved by activating valves 138 and 146 causing the guide rod 84 to move toward the rod 148 which has been extended one half the cross shift distance between the FOOT and HEAD positions. Thus the required cassette positions can be obtained by selective actuation of the electrically operated control valves for the cylinders 100, 134, and 144, as well as the longitudinal carriage stops 122, 124 and 126.

Figure 3A:
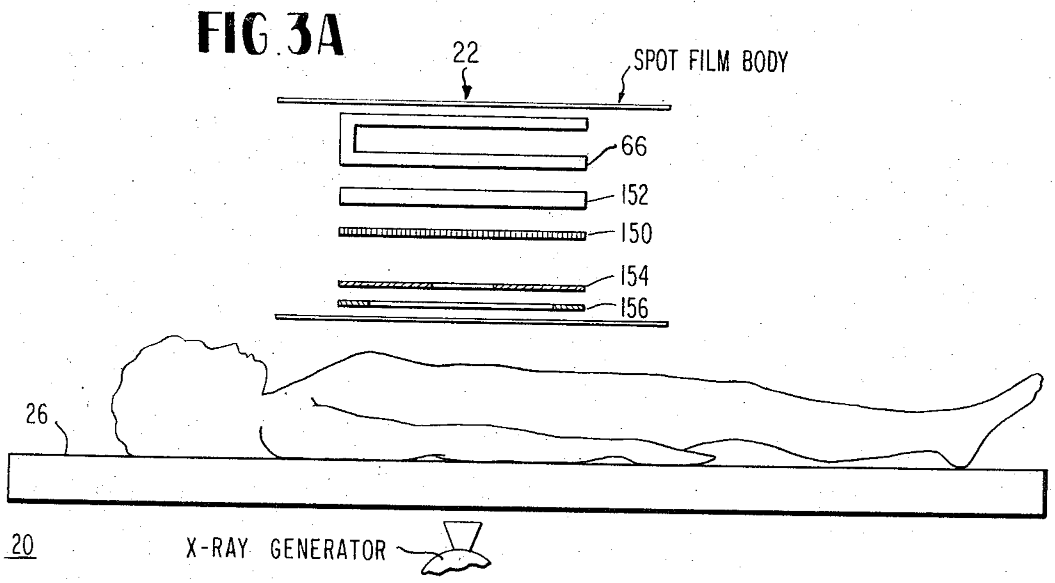
FIG. 3A is a schematic diagram illustrative of the relative position of the cassette tray in combination with a pair of selectively positioned radiographic masks and grid.

In addition to the selected movement of the cassette tray 66 within the housing of the spot film device 22, there is also included a mechanism for moving an oscillating grid 150 from a storage position to an active position and return so that one may selectively use or delete the grid in connection with making an X-ray exposure. Such grids are well known to those skilled in the art, and consists of a generally rectangular frame equipped with a series of usually parallel bars of lead or other material which is impervious to penetration by X-rays. This has the effect of filtering out so-called scatter radiations reflected by the patient and thus would be approaching the film at an angle. Since the radiographic exposure is desired to be made essentially by the primary, substantially parallel radiation passing directly through the patient to the grid, the oscillating grid is caused to reciprocate back and forth during the X-ray exposure, producing the filtering effect insofar as scatter radiation is concerned, but obviating the appearance of the grid bars on the finished radiograph. The position of the oscillating grid is shown positioned in the X-ray field in FIG. 3A.

Figure 3B:
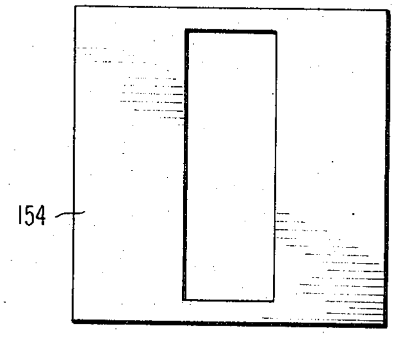
FIGS. 3B–3D are illustrative of the configuration and relative position of the pair of radiographic masks referred to in FIG. 3A.
Figure 3C:
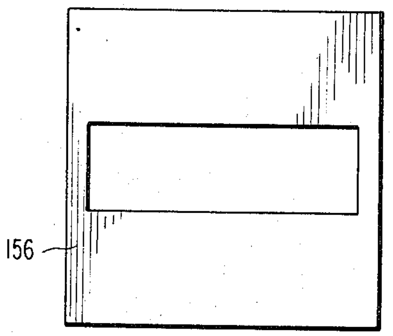
Figure 3D:
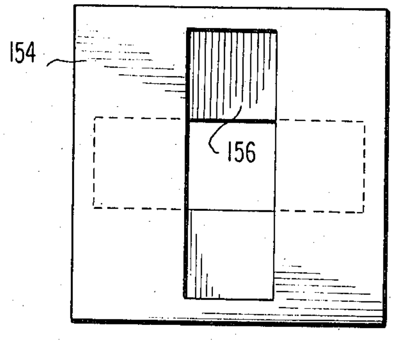

In addition to the oscillating grid 150, there is usually also provided a photo-timing attachment 152, as well as a pair of radiographic masks 154 and 156 which are respectively shown in FIGS. 3B and 3C. The masks like the oscillating grid shield areas of the X-ray film not in the immediate exposure areas from scatter radiation. Each of the masks 154 and 156 shown in FIGS. 3B and 3C has a rectangular opening and each is independently movable with respect to the other; however, the openings are adapted to be mutually orthogonal, such that one mask has an opening with the long dimension parallel to the center line of the table for esophageal and spinal studies in the 2-on-1(L) longitudinal sequence while the other mask is used for a 2-on-1(C) cross sequence for gall bladder and gastrointestinal studies. When both masks are used together, the resulting opening is a reduced square opening which is the correct size for 4-on-1 sequences.

In order to selectively position the cassette tray 66, the oscillating grid 150 and the pair of radiographic masks 154 and 156, as well as initiating an X-ray exposure, the present invention includes a digital control system which receives binary electrical input signals from manually operated and position sensing switches, combines them according to predetermined binary logic and then generates appropriate electrical control signals which are then applied to the actuator and stop means.

Figure 4:
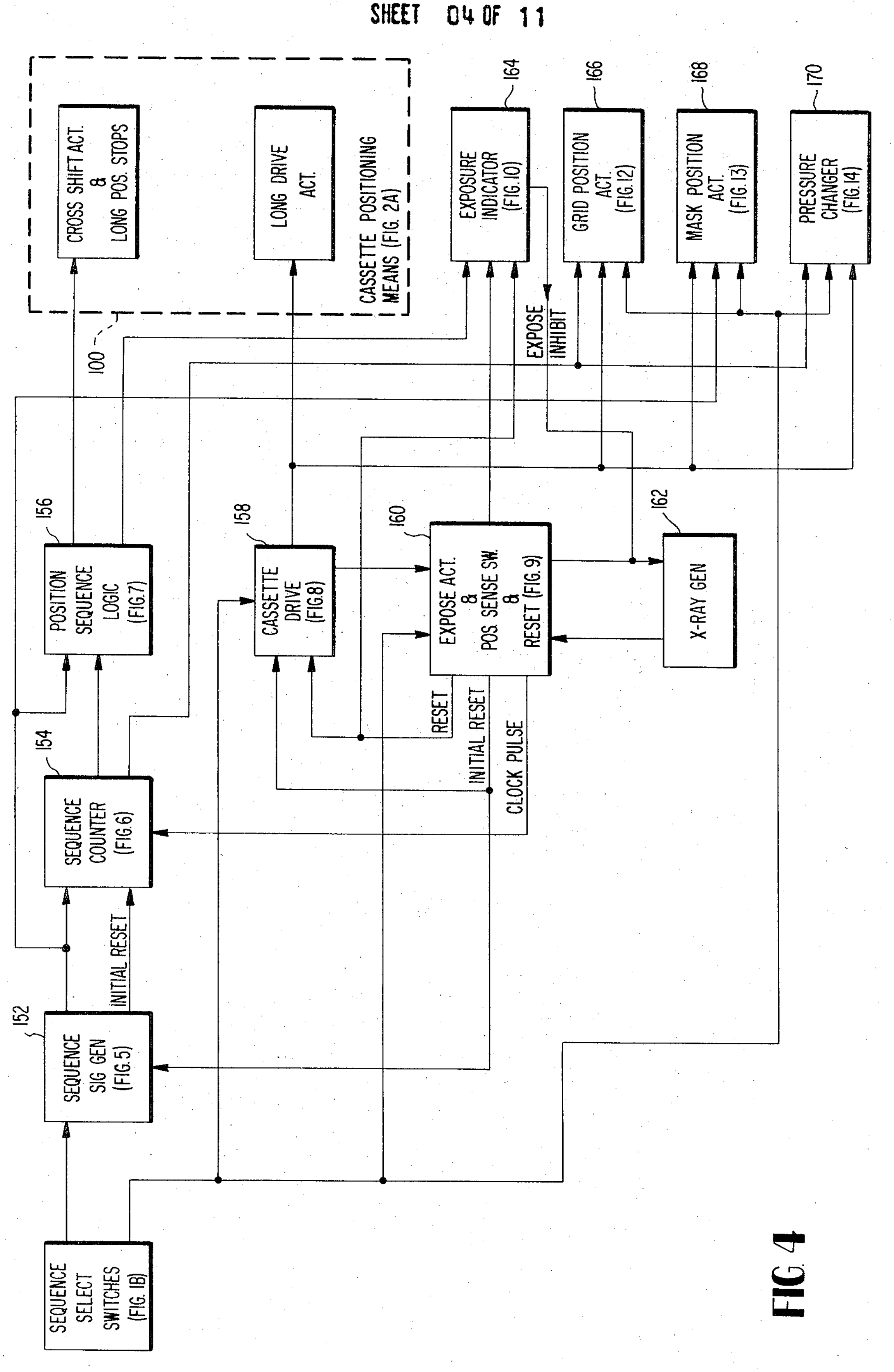
FIG. 4 is an electrical block diagram illustrative of the digital logic and control circuitry contemplated by the subject invention.

The digital control system for operating the subject spot film device is broadly illustrated in block diagrammatic form in FIG. 4. It comprises a sequence signal generator circuit 152 coupled to the filming sequence selector switches 36, 38, 40, 42, and 44 shown in FIG. 1B for providing four filming sequence signals from which the operator may choose a 4-on-1 sequence, a 2-on-1(L) i.e. the long dimension of the exposed area parallel to the center line of the table top, 2-on-1(C) i.e. with the long dimension transverse or cross the table top center line, a 1-on-1 sequence and a LOAD sequence. This circuit is shown in detail in FIG. 5 and will be discussed subsequently. Binary output signals corresponding to the desired filming sequence are fed into a sequence counter 154 which is shown in detail in FIG. 6 and into a position sequence binary logic circuit 156 shown in detail in FIG. 7. The logic circuit 156 is adapted to generate electrical solenoid operated pneumatic valve control signals for operating the cassette tray 66 cross-shift actuators and the longitudinal position stops for the carriage 74 shown in FIG. 2A. Additionally, a cassette carriage longitudinal drive circuit 158 shown in FIG. 8 operates in response to manually selective PARK and ADVANCE positional switches 33 and 34, RAPID sequence switch 46 and internally contained cassette position sensing switches for operating the longitudinal drive cylinder 100 shown in FIG. 2A. Once the cassette has been driven to its proper position, a circuit 160 shown in detail in FIG. 9 operates in response to operator actuated EXPOSE, FOOT-SWITCH, and RAPID switches 32, 35 and 46 and cassette position sensing switches which if certain conditions are met, activates an X-ray generator 162. The X-ray generator 162 at the end of the exposure is adapted to provide a signal pulse which triggers reset circuitry which generates a binary output for activating the cassette drive circuit 158 as well as generating an indexing or clock pulse for the sequence counter 154. Also an initial reset signal is produced when the carriage 174 is moved back to the PARK position. Furthermore, an indexing clock pulse is also adapted to be generated when the SKIP push-button 50 is actuated on the control panel 30 for deleting an exposure on the X-ray film when desired by the operator.

Figure 10:
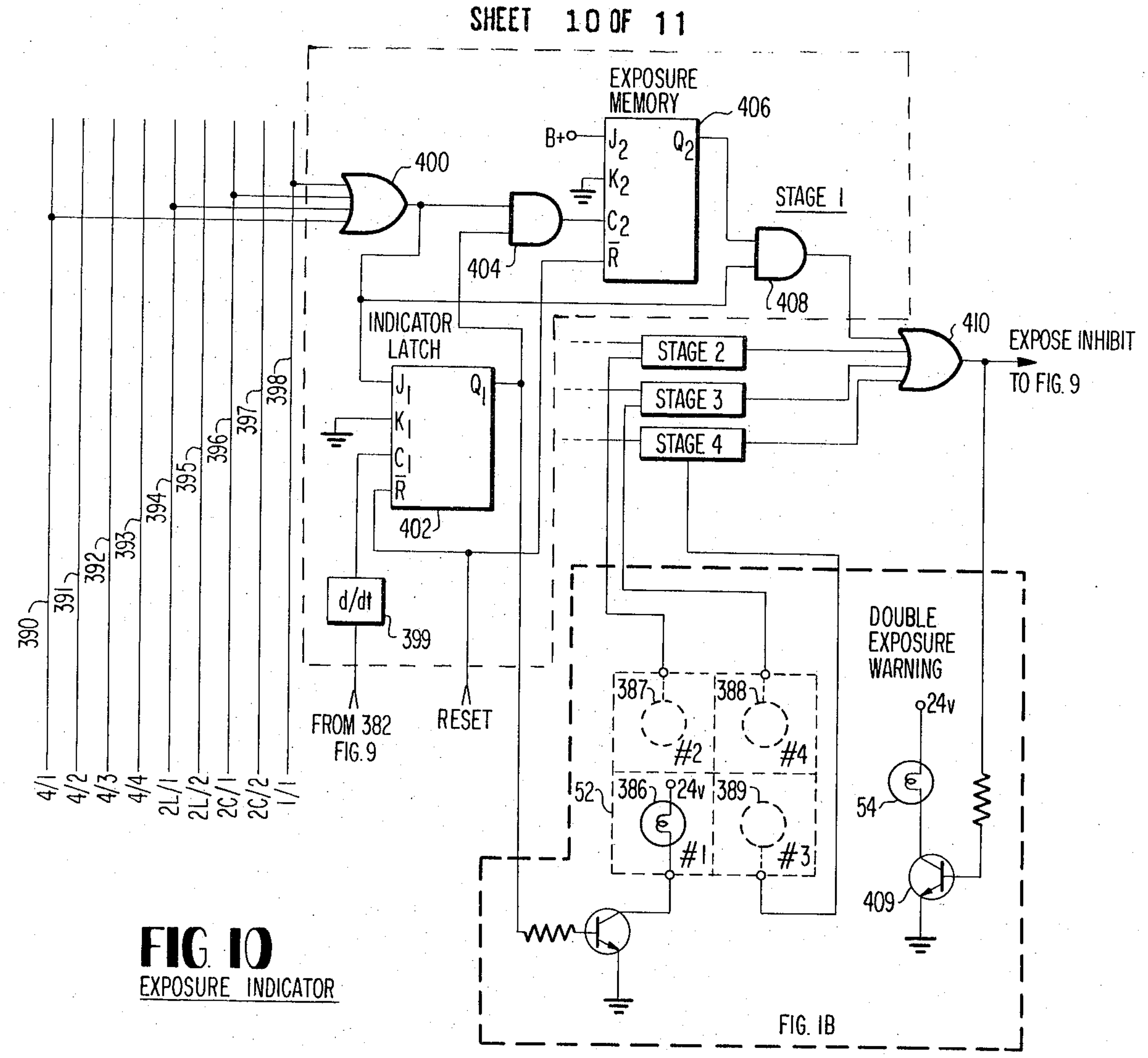
FIG. 10 is an electrical schematic diagram illustrative of the digital circuitry for driving the exposure indicator referred to in FIG. 4.
Figure 12:
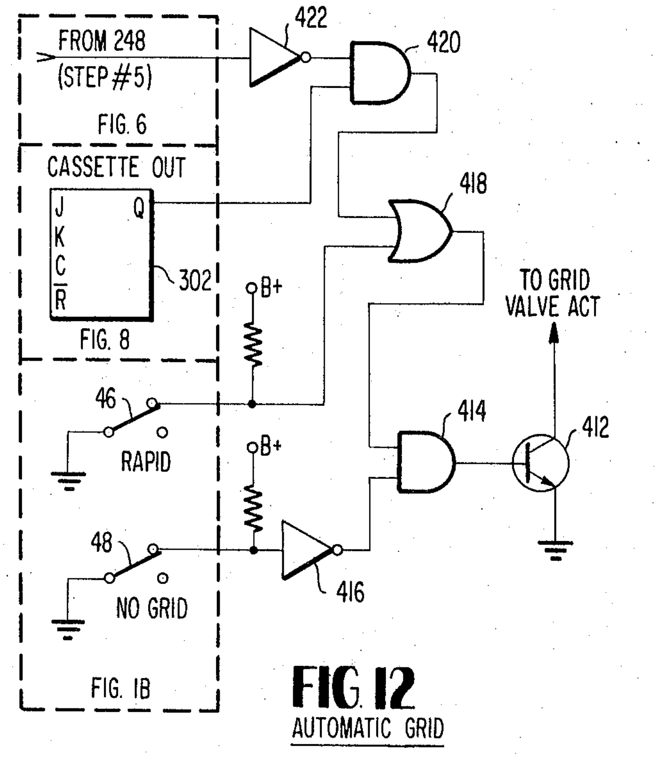
FIG. 12 is an electrical schematic diagram illustrative of the digital circuitry comprising the radiographic grid position actuator referred to in FIG. 4.

An exposure indicator circuit 164 is partially shown in FIG. 10 and is adapted to activate the indicator light assembly 52 or the error indicator lamp 54 shown on the control panel 30. An oscillating grid position actuator circuit 166 is shown in FIG. 12 and is adapted to receive predetermined binary signals from sequence counter circuit 154, the cassette drive circuit 158, the exposure actuator circuitry 160 and a manually operated NO GRID switch 48 included on the control panel 30. As mentioned earlier, the position of the radiographic masks shown in FIGS. 3B and 3C respectively are controlled by a circuit 168 shown in detail in FIG. 13, receiving predetermined binary inputs from the position sequence logic circuit 156, the cassette drive circuit 158, and signals corresponding to the position of manually operated switches 33 and 46 contained on the control panel 30 shown in FIG. 1B. Finally, a pressure changer circuit 170 and shown in detail in FIG. 14 which is adapted to provide a dual speed pneumatic control of the longitudinal movement of the cassette carriage 74 by varying the pneumatic pressure applied to the drive cylinder 100 for moving the cassette forward at a relatively higher speed then back to the PARK position.

Considering now the digital control system in greater detail, it is to be pointed out that positive binary logic is utilized throughout, meaning that a binary "1" is signified by a positive DC potential having a relatively "high" value while a binary "0" is signified by a zero DC voltage level or a positive DC voltage level of a relatively "low" value.

Figure 5:
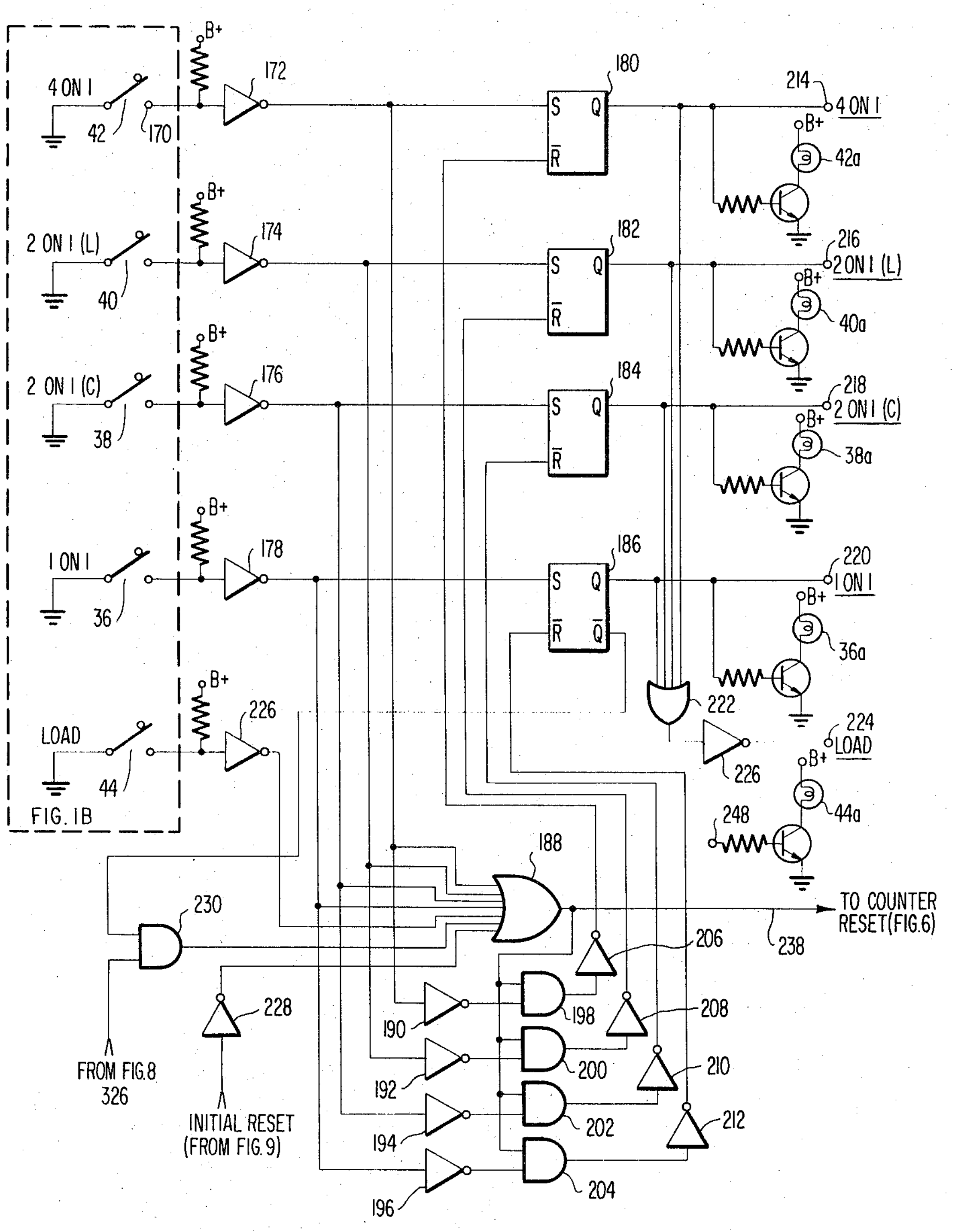
FIG. 5 is an electrical schematic diagram illustrative of the digital sequence signal generator referred to in FIG. 4.

Referring to FIG. 5, the four filming sequence push-button switches 36, 38, 40 and 42 as well as a LOAD push-button switch 44 which are located on the control panel 30 and shown in FIG. 1B are illustrated in their respective normally non-actuated states. Switch 36 is used to select the 1-on-1 sequence, switch 38 is used to select the 2-on-1(C) or cross sequence, switch 40 is used to select the 2-on-1(L) or longitudinal sequence, switch 42 is utilized to select the 4-on-1 sequence, and switch 44 is utilized to initiate a cassette LOAD sequence. It is to be noted that each of the switches 36 ... 44 has the wiper contact terminal returned to ground while the normally open fixed switch contact is coupled to a B+ supply voltage through an electrical resistor. In the unactuated position shown, the voltage at the open switch terminal as shown exhibits a high or binary 1 state, whereas operation of the switch would cause the resistor to be grounded causing the voltage thereat to exhibit a low or binary 0 state. Accordingly, each of the four filming sequence switches 36, 38, 40 and 42 are coupled to respective logic inverters 172, 174, 176 and 178 whose outputs are coupled to the set (S) input of respective flip-flop circuits 180, 182, 184 and 186 as well as to one input of a multi-input OR gate 188. Additionally, the outputs of the logic inverters 172, 174, 176 and 178 feed into respective inverters 190, 192, 194 and 196 which feed into AND gates 198, 200, 202, and 204 having a common input from the OR gate 188. The AND gates 198 ... 204 are coupled back to the complement or the reset input ($\bar{R}$) of the flip-flops 180, 182, 184 and 186 by means of logic inverters 206, 208, 210, and 212. The Q output terminal of the flip-flops 180, 182, 184 and 186 are respectively coupled to a 4-on-1 output terminal 214, a 2-on-1(L) output terminal 216, a 2-on-1(C) output terminal 218 and a 1-on-1 output terminal 220 as well as separate inputs to an OR gate 222 whose output is fed to a LOAD output terminal 224 through a logic inverter 226.

Manual operation of any of the four push-buttons 36, 38, 40 or 42 sets the respective flip-flop 180, 182, etc. while resetting all other flip-flops through the AND gates 198, 200, 202 and 204 thereby producing a respective binary 1 output on only one of the terminals 214, 216, 218, 220 and 224. Also the push-button lights associated with the push-button switches 36, 38, 40 and 42 are energized. If none of the four film sequence push-buttons 36, 38, 40 or 42 are pushed, the OR gate 222 will provide a binary 1 signal at LOAD sequence output terminal 224. Additionally, the LOAD push-button 44 is coupled to the OR gate 188 through a logic inverter 226. The output of the OR gate 188 is adapted to reset the flip-flops 180 ... 186 and provide a binary 1 output at terminal 224 as well as providing a counter reset signal to the sequence counter shown in FIG. 6. The OR gate 188 is also adapted to receive an initial reset signal from the exposure circuit shown in FIG. 9 by means of a logic inverter 228 as well as an automatic 1-on-1 recycle signal provided by AND gate 230 in response to the $\bar{Q}$ output of flip-flop 186 and a position sensing switch which will reset a 1-on-1 sequence after each loading of a cassette. Thus selective energization of the five push-button switches 36 through 44 shown in FIG. 5 will generate a corresponding binary 1 signal on the appropriate signal generator output terminal 214, 216 ... 224 as well as lighting the associated push-button indicator lamp.

Figure 6:
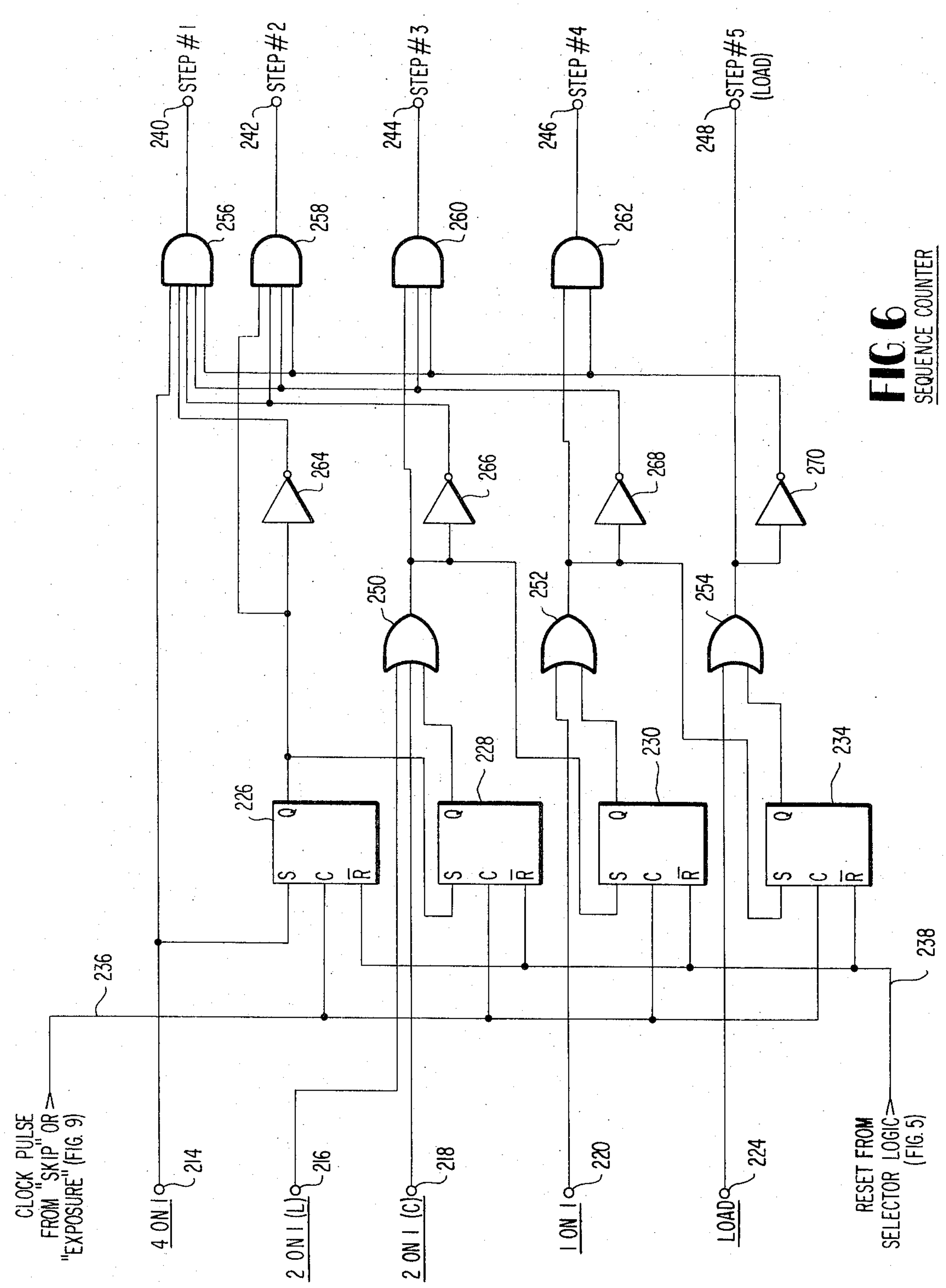
FIG. 6 is an electrical schematic diagram illustrative of the digital sequence counter referred to in FIG. 4.

Referring now to FIG. 6, there is disclosed the sequence counter circuit. It is comprised of four flip-flop circuits 226, 228, 230, and 234 having their respective count C input terminals coupled to a clock signal supplied from the exposure circuit shown in FIG. 9 on circuit lead 236. Also a reset signal is applied to the complements of the reset input $\bar{R}$ supplied from the output of the OR gate 188 shown in FIG. 5 on circuit lead 238. The sequence counter is adapted to operate such that if for example a 4-on-1 sequence is selected, it will index with each clock pulse and generate five sequential "step" output signals at respective terminals 240, 242, 244, 246, and 248. Accordingly, the Q output of the first flip-flop 226 is coupled to the set S input of 238 the next flip-flop while the Q output of flip-flop 228 is coupled to the S input of adjacent flip-flop 230 through the OR gate 250 which has inputs coupled to both 2-on-1 sequence output terminals 216 and 218. The Q output of flip-flop 230 is coupled to the set S input of flip-flop 234 through OR gate 252 which also has an additional input coupled to the 1-on-1 terminal 220. The Q output of flip-flop 234 is coupled to "step 5" output terminal 248 by means of OR gate 254 which is also adapted to receive a LOAD input signal from terminal 224.

In order that the proper sequence is maintained, AND gates 256, 258, 260 and 262 are utilized in combination with logic inverter circuits 264, 266, 268 and 270. With the Q outputs of each of the flip-flops 226 ... 234 initially in the low or binary 0 state, each clock pulse from the exposure circuit shown in FIG. 9 will sequentially cause the Q output of the flip-flops to go to a binary 1 depending upon which of the sequence terminals 214, 216, 218, 220 or 224 has a binary 1. Thus step 1 output terminal 240 is 1 if the 4-on-1 sequence has been selected and a binary 1 appears at terminal 214 and if the other inputs to the AND gate 256 are in a binary 0 or low state. "Step 2" output terminal 242 then becomes 1 upon the subsequent clock pulse when the first flip-flop circuit 226 is triggered to its high state. This also makes step 1 terminal 240 revert back to a binary 0 state. Step 3 output terminal 244 is initially 0, but it can be set to a binary 1 by either of the 2-on-1 sequence signals appearing on terminals 216 or 218 or by the next clock pulse following step 2. Again, when step number 3 output terminal 244 becomes a binary 1, step 2 output terminal 242 must return to binary 0. "Step 4" output terminal 246 can become a binary 0 by a 1-on-1 sequence binary 1 signal appearing at terminal 222 or by the first count pulse after step 3. Finally, "step 5" output terminal 248 can become a binary 1 by a binary 1 on terminal 224 or by the first clock pulse following step 4.

Thus, it can be seen that depending upon which sequence is selected, each clock pulse will cause the counter to step from the initially selected sequence to step 5. For example, if a 4-on-1 sequence is selected, a binary 1 output signal will sequentially appear on each of the output terminals 240, 242, 244, 246 and 248 while if a 2-on-1(C) cross sequence is selected, steps 3, 4 and 5 will be provided and a binary 1 will appear on terminals 244, 246 and 248 sequentially for each consecutive clock pulse.

Figure 7:
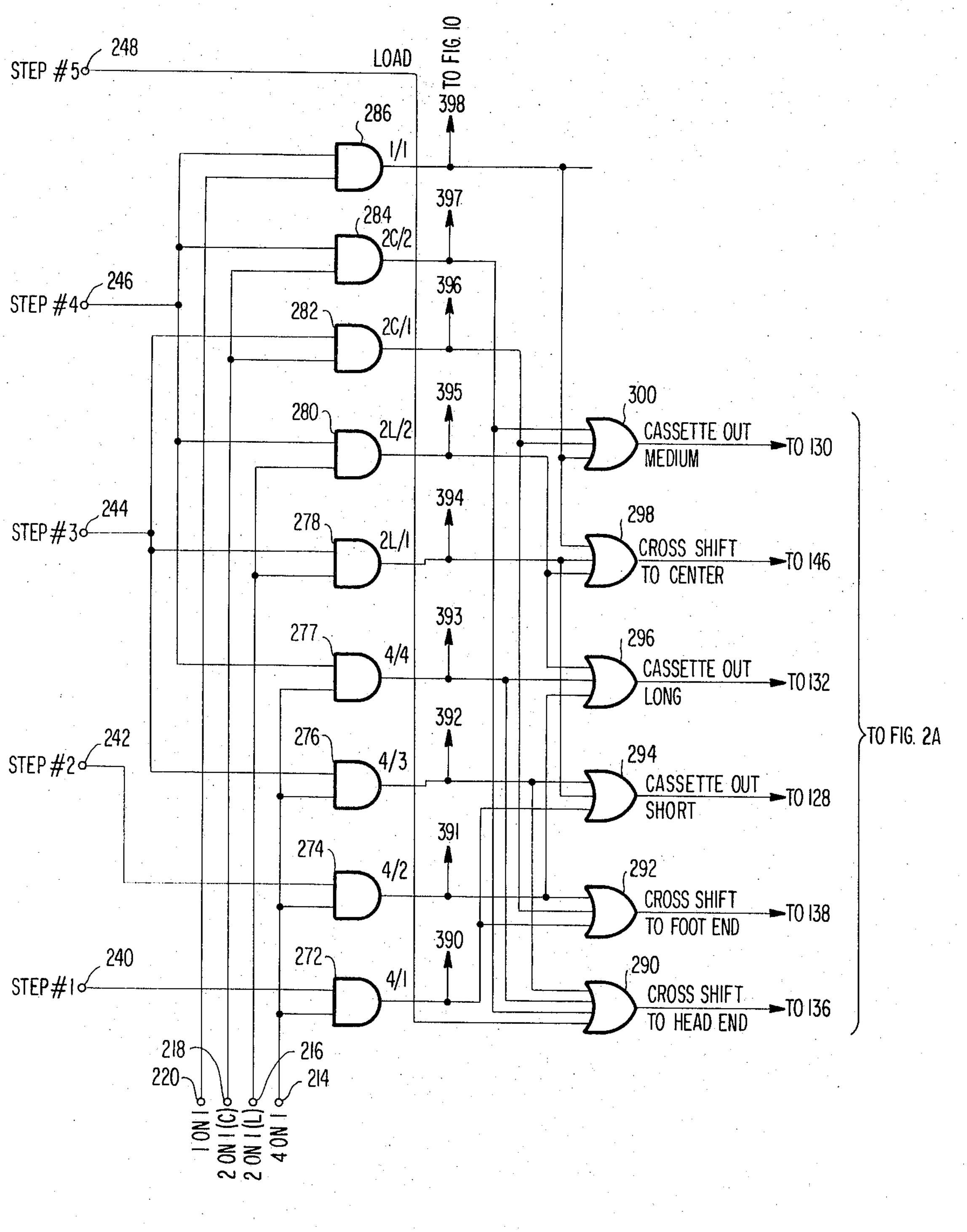
FIG. 7 is an electrical schematic diagram illustrative of the digital cassette position sequence logic circuitry referred to in FIG. 4.

Next the position sequence logic circuit shown in FIG. 7 is coupled to respective output terminals of the sequence selector circuit shown in FIG. 5 and the sequence counter circuit shown in FIG. 6. The circuit in FIG. 7 includes nine AND gates and six OR gates. More specifically, the 4-on-1 sequence terminal 214 is commonly applied to one input of AND gates 272, 274, 276 and 278, while the 2-on-1(L) input terminal 216 is commonly applied to one input of AND gates 278 and 280. The 2-on-1(C) input terminal 218 is commonly applied to AND gates 282 and 284 while the 1-on-1 input terminal 220 is applied to one input of AND gate 286. The step 1 terminal 240 is applied to the other input of AND gate 272 while the step 2 input terminal 242 is connected to the other input of AND gate 274. Step 3 input terminal 244, however, is commonly applied to the other input of AND gates 276, 278 and 282. Step 4 terminal 246 is applied to the remaining input of AND gates 277, 280, 284, 286.

Referring now to the OR gates, the first OR gate 290 is adapted to receive inputs from step 5 terminal 248 as well as the outputs from AND gates 284, 277 and 276. OR gate 292, on the other hand, has three inputs respectively connected to the output of AND gates 272, 274 and 282. OR gate 294 has three inputs respectively connected to the output AND gates 272, 276 and 278. OR gate 296 also has three inputs respectively connected to the output of AND gates 274, 277 and 280. The fifth OR gate 298 has three inputs respectively connected to the output of AND gates 278, 280 and 286. The final and last OR gate has inputs connected to the output of AND gates 282, 284 and 286.

The combination of the inputs applied to the AND gates and then to the appropriate OR gates provides six electrical control signals for selectively actuating solenoid operated valves which control the cross shift actuators of the cassette and the three longitudinal stops shown in FIG. 2A. The output of the OR gate 290 is coupled to solenoid valve 136 for driving the piston 140 of the cross shift drive cylinder 134 to the HEAD end. The output of OR gate 292, on the other hand, is coupled to electrical solenoid valve 138 which when activated drives the piston 140 in the opposite direction, causing the carriage 74 and cassette tray 66 to move to the FOOT end. The CENTER cross shift position is obtained by means of the output of the OR gate 298 which is coupled to the control valve 146 and the output of OR gate 292. The three OR gates 294, 296 and 300 provide respective outputs which are coupled to solenoid valves 128, 132 and 130 for providing actuation of the SHORT, LONG and MEDIUM carriage stops. Thus the binary circuitry shown in FIG. 7 is adapted to select the correct longitudinal and cross stops to locate the cassette when it is driven to a selected position. The three longitudinal stops are retracted, moreover, whenever the cassette is moving towards the PARK position but then are allowed to operate when the PARK position is reached.

Figure 8:
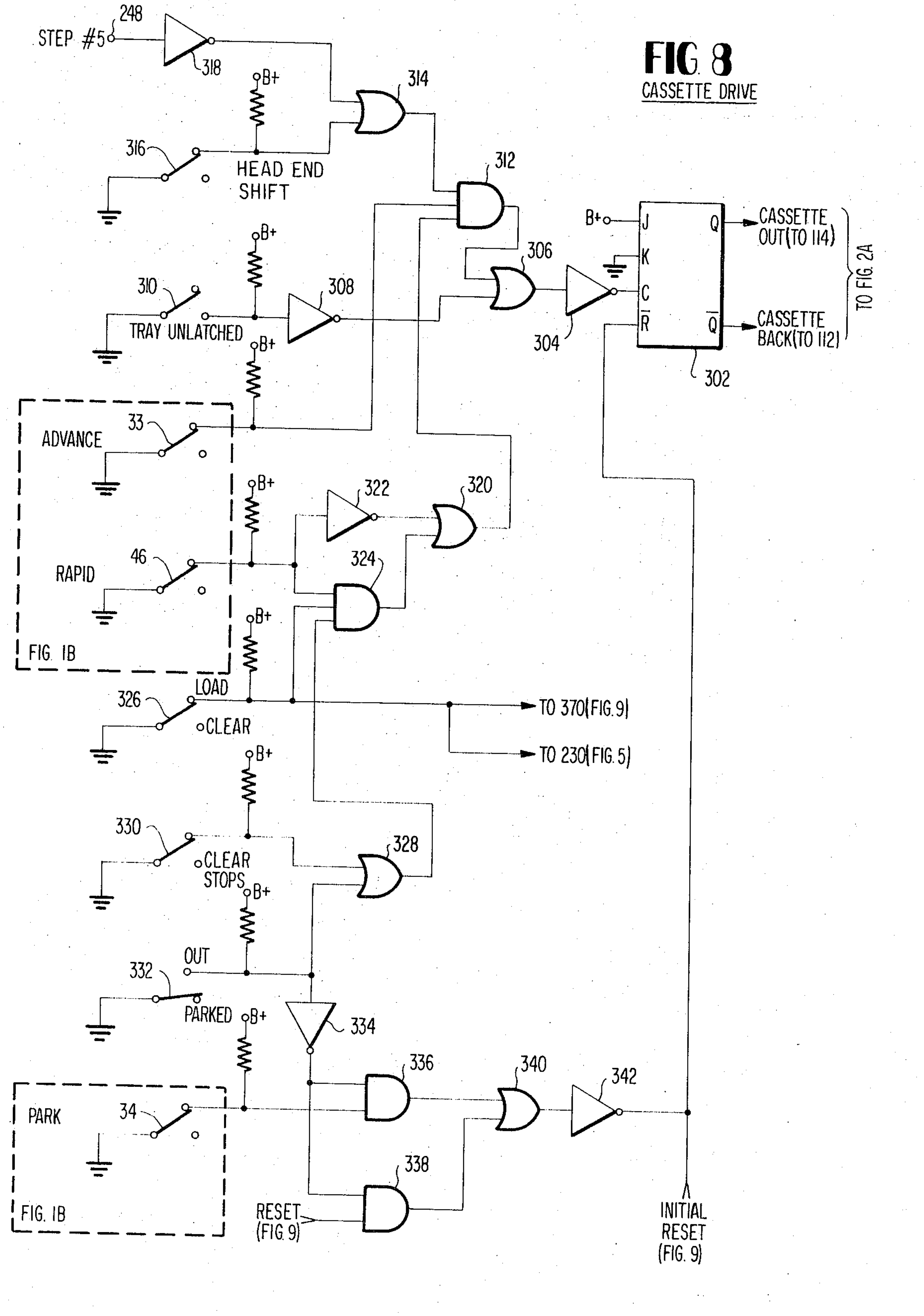
FIG. 8 is an electrical schematic diagram illustrative of the digital cassette drive circuit referred to in FIG. 4.

The longitudinal motion of the carriage 74 shown in FIG. 2A is effected by the binary circuitry shown in FIG. 8 and operates simultaneously with the circuitry shown in FIG. 7. A cassette carriage drive flip-flop 302 is adapted to conntrol solenoid operated valves 112 and 114, alternately, for example by coupling valve 112 to the Q output while coupling the opposite control valve 114 to the complementary output $\bar{Q}$. Depending upon the selective actuation of the PARK, ADVANCE and RAPID mode switches 34, 33 and 46 on the control panel 30 shown in FIG. 1B, and the state of the plurality of position sensing switches shown in FIG. 8, the flip-flop 302 is either set or reset accordingly.

The cassette drive flip-flop circuit 302 comprises a J-K flip-flop having its K input connected to ground while its J input is connected to a B+ supply potential. The count C input is coupled to a logic inverter 304 coupled to an OR gate 306 having one input coupled from a logic inverter 308 which couples to position sensing switch 310. This switch is adapted to be closed only in the event that an X-ray cassette manually inserted at the loading aperture 37 (FIG. 1B) is not firmly seated and latched in the cassette tray 66. The other input to the OR gate 306 is provided by the output of an AND gate 312 having one input coupled from an OR gate 314 which receives as one input a binary signal from position sensing switch 316 which is adapted to be closed when the cassette carriage is positioned at the HEAD end. The other input to the OR gate 314 is coupled to the output of a logic inverter 318 which is adapted to be coupled to the LOAD sequence step 5 signal appearing on terminal 248 of FIG. 6. The second input to the AND gate 312 is coupled to the manually operated ADVANCE switch 33 while its other input is coupled to an OR gate 320 having inputs from the logic inverter 322 and an AND gate 324.

Figure 9:
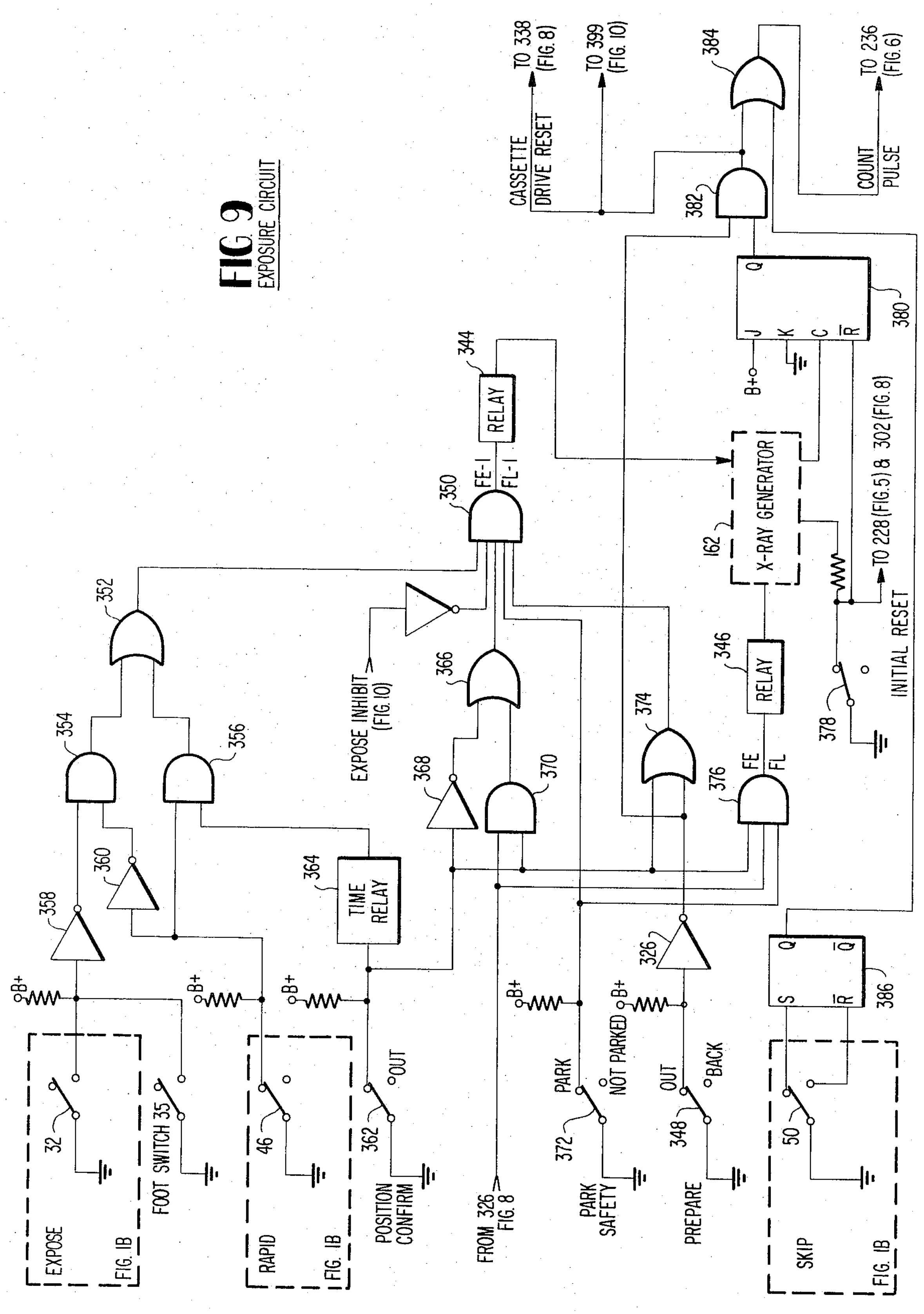
FIG. 9 is an electrical digital schematic diagram illustrative of the exposure actuator circuit, position sensing switches, and reset circuitry, referred to in FIG. 4.

Logic inverter 322 is coupled to the RAPID exposure mode switch 46 as is one input to the AND gate 324. The second input to AND gate 324 is connected to position sensing switch 326 which is located adjacent the loading aperture 37 (FIG. 1B) being in the position as shown when the cassette tray is in the LOAD position but being moved to the opposite position and providing a binary 1 input to AND gate 324 when the cassette tray is clear of the LOAD position. The third input to the AND gate 324 is provided from OR gate 328 having one input connected to cassette position sensing switch 330 which provides a binary 1 output when the cassette carriage 74 clears the longitudinal stops shown in FIG. 2A. Also, when the cassette is in a radiographic position, position sensing switch 332 is activated coupling a binary 1 signal both to the OR gate 328 and a logic inverter 334. The output of the logic inverter 334 is coupled to a pair of AND gates 336 and 338 which respectively receive their other inputs from the manually operated PARK switch 34 and a reset signal from the exposure circuit (FIG. 9). The outputs of AND gates 336 and 338 feed into an OR gate 340 which couples to the $\overline{R}$ input of flip-flop 302 by means of logic inverter 342. The $\overline{R}$ input of reset flip-flop 302 is also coupled to an initial reset signal (FIG. 9).

The various switches are so interlocked that before the carriage 74 can be advanced to a selected radiographic position, either the cassette tray 66 must be cross shifted to the HEAD end such that the binary output from position switch 316 is a binary 1 or the selected filming sequence must be other than a LOAD sequence i.e. the binary value at terminal 248 is a $\overline{\text{step 5}}$, in order to prevent collision of the cassette tray with the ejector mechanism, not shown. Also if the cassette tray latch, not shown, is not closed, the output from position sensing switch 310 will be a binary 1, causing the cassette to be returned to the LOAD position so that the cassette can be repositioned in the tray 66. If the RAPID mode switch 46 is not operated, the ADVANCE switch 33 when depressed will cause the cassette tray 66 to advance by causing the flip-flop 302 to provide a Q output signal of a binary 1.

At the end of each exposure, a reset signal is applied to the $\overline{R}$ input of flip-flop 302 causing the cassette carriage 74 to return to the PARK position which is standard operating procedure. When a RAPID sequence is required, for example, where a 4-on-1 or 2-on-1 series is desired without the cassette returning to the PARK position, the RAPID selector switch 46 is activated causing a binary 1 signal to be continuously applied to the logic inverter 322 from where it is then coupled as a binary 0 to the AND gate 312 and where it is subsequently reapplied as a binary 1 to the C input of flip-flop 302 due to the logic inversion provided by logic inverter 304. When the ADVANCE switch 33 is depressed the carriage 74 will advance the cassette to an exposure position, however, when the exposure is made and the carriage 74 has moved back far enough to clear the longitudinal stops, it will actuate position sensing switch 330, again causing a binary 0 signal to be transmitted which will cause AND gate 312 and logic inverter 304 to couple a trigger signal to the C input of 304. This will continue until the series is complete. If the ADVANCE switch 33 is released for any reason, the series will terminate immediately.

Thus what has been considered up to this point is the binary logic circuitry for controlling pneumatic driven means and positional stops for selectively and independently positioning the cassette carriage and tray automatically along orthogonal coordinates in response to a selected sequence of desired X-ray exposures or for moving the cassette tray to the LOAD position.

Directing attention now to the circuitry shown in FIG. 9, it is designed to interface with the X-ray generator 162 through four relays, two of which comprise an "exposure" relay 344 and a "radiographic exposure position" relay 346 shown in FIG. 9. These two relays are illustrated because they are operated by operator actuator switches and position interlock switches as well as additional binary logic circuitry. The other two relay circuits, not shown, constitutes a "prepare" relay which is operated simultaneously with a position sensing switch 348, indicative of the cassette carriage leaving or advancing from the PARK position while the other relay which might be referred to as the "advance" relay, opens and closes in parallel with the operation of the manually operated ADVANCE switch 33 shown in FIG. 1B. They act as safety interlock relays.

The exposure relay 344 is operated as the result of an output from an AND gate 350 which receives four inputs corresponding to actuation of one of three exposure switches and certain position sensing switches. The EXPOSE switch 32, the RAPID switch 46 and a FOOT actuated switch 33 selectively pressed by the operator, couple to the AND gate 350 by means of an OR gate 352, AND gates 354 and 356, and a pair of logic inverters 358 and 360. Additionally, an exposure position confirmation switch 362 is coupled to the AND gate 356 through a short time delay circuit 364. The second input to the AND gate 350 is provided from an OR gate 366 which has inputs from a logic inverter 368 coupled to the position confirmation switch 362 and an AND gate 370 which also receives an input from the position confirmation switch 362 and from the position sensing switch 326 shown in FIG. 8 which operates when the LOAD position is cleared. The third input to the AND gate 350 is provided from a "park safety" switch 372, while a fourth input to the AND gate 350 is provided from an OR gate 374 which is adapted to receive inputs from the position confirmation switch 362 and the prepare switch 348 also including a logic inverter 376.

In order for exposure relay 344 to operate, the binary logic circuitry in combination with the various switches shown in FIG. 9 dictate that the cassette tray must be in the advance or non-park position, and not midway therebetween and additionally it must also be in a non-loading sequence. In a non-RAPID mode, either the EXPOSE switch 32 or the FOOT switch 33 will then initiate a single exposure. In a RAPID mode when the cassette tray reaches the advance position and after a 0.1 to 0.2 second time delay provided by the time delay circuit 364 for allowing motion to damp out, a plurality of exposures will be initiated in rapid fire sequence.

The foregoing is true only in the event that the radiographic exposure position relay 346 is activated in response to a logic signal from an AND gate 376 having three inputs coupled thereto from the park safety switch 372, the position confirmation switch 362, and the load zone switch 326. Thus the relay is operated if the spot film device is not parked, the cassette has arrived at the exposure position and the sequence is non-loading. Additionally, the circuitry in FIG. 9 also discloses an initial reset switch 378 which is adapted to be operated when the cassette returns to the PARK position and provides a binary 1 output signal at that time which signal is coupled to the sequence signal generator in FIG. 5 and the cassette drive circuitry shown in FIG. 8 for resetting the associated flip-flops.

At the end of each X-ray exposure, the X-ray generator 162 provides an end of exposure signal pulse which is coupled to trigger a one-shot flip-flop circuit 380 whose Q output terminal is coupled to AND gate 382, which also receives an input from the switch 348, indicating that the cassette tray is not in the PARK position. The output of the AND gate 382 provides a cassette drive reset signal which couples back to the AND gate 338 of FIG. 8, as well as for triggering the exposure indicator circuit shown in FIG. 10. Additionally, the output of AND gate 382 is fed through an OR gate 384 to provide a count pulse for the sequence counter shown in FIG. 6. The purpose of the OR gate 384 is that in addition to the count pulse provided at the end of each exposure, the subject invention is also adapted to provide indexing count pulse by the actuation of the SKIP push-button switch 50 on the front panel 30 for skipping a selected exposure. This second or indexing count pulse is provided by means of a flip-flop circuit 386 coupled to the SKIP push-button 50 shown in FIG. 1B. The Q output of the flip-flop circuit 386 is coupled to the other input of the OR gate 384. Thus a clock pulse is coupled to circuit lead 236 shown in FIG. 6, either at the end of each exposure, or by the depression of the SKIP push-button switch 50 by the operator.

At the end of each exposure the exposure indicator circuit 164 as shown in FIG. 10 provides a lighted display which resembles the four quadrants of the film cassette. More particularly, the exposure indicator 52 included on the front panel 30 as shown in FIG. 1B, includes four separate indicator lamps 386, 388, 390 and 392 which represent respective quarters of the film and are illuminated to correspond to areas of the film which have been exposed. Each of the indicator lamps is controlled by a respective transistor driver which responds to a control flip-flop. Since four identical circuits are required, only one of the circuits is illustrated in FIG. 10. Referring now to FIG. 10, nine circuit leads 390, 391, 392, 393, 394, 395, 396, 397 and 398 are shown which couple back to the cassette position sequence logic circuitry shown in FIG. 7. The indicator light 386 for example is adapted to be lit in the event that a 4-on-1, 2-on-1(L), 2-on-1(C) and a 1-on-1 filming sequence is made. Accordingly, an OR gate 400 has respective inputs coupled to lines 390, 394, 396 and 398. At the end of each exposure, a binary 1 signal generated by the flip-flop 380 shown in FIG. 9 appears at output of AND gate 382. This is differentiated and fed to J-K flip-flop 402 which is triggered together with the input from the OR gate 400 whereupon its $Q_1$ output goes to a binary 1, causing indicator light 386 to light. In order to prevent a double exposure by providing an indication of an attempted double exposure, the $Q_1$ output from the flip-flop circuit 402 and the output of the OR gate 400 is fed to an AND gate 404 which is adapted to actuate a memory flip-flop 406. Another AND gate 408 receives the $Q_2$ output of flip-flop 406 and the output from the OR gate 400 to turn-on transistor 409 lighting the double exposure warning light 54. Thus if through operator error the same exposure designation is selected once again, the warning lamp 54 will become energized, but also an inhibiting signal will be sent to the exposure circuit (FIG. 9).

Figure 11:
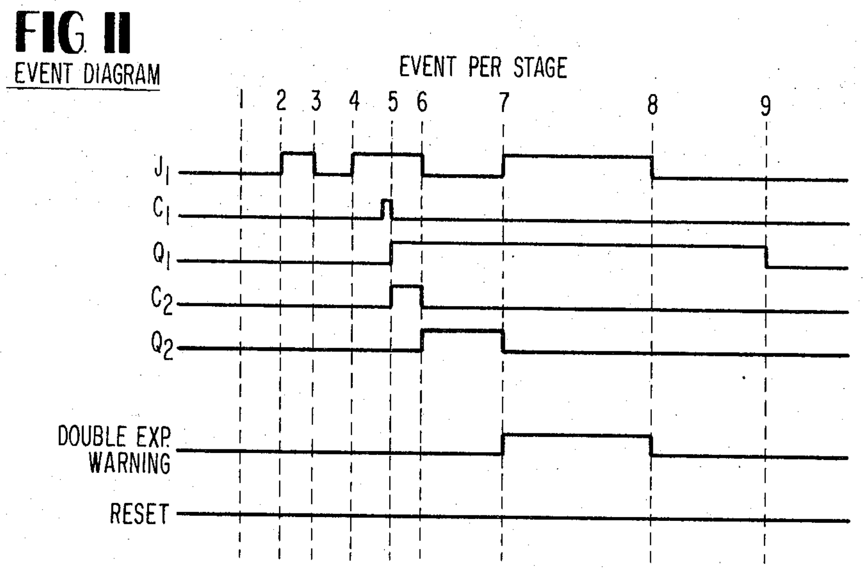
FIG. 11 is an event timing diagram illustrative of the operation of the exposure indicator circuit.

The operation and timing sequence of the exposure indicator circuitry shown in FIG. 10 can further be described with reference to the timing diagram shown in FIG. 11 wherein 9 events are noted. The first event (event 1) is where no indicator lamp is lit and the $J_1$ signal (FIG. 10) from OR gate 400 to the flip-flop 402 becomes a binary 0. If a cassette position is selected such that the $J_1$ signal becomes a binary 1 as in event 2 and there is no exposure made, event 3 shows the return to the normal position where signal $J_1$ again becomes a binary 0. In event 4 a new cassette position is again selected, the $J_1$ signal goes high and noting the signal $C_1$, an exposure is made which ends at event 5 whereupon the $Q_1$ and $C_2$ binary signals goes high, causing a quadrant lamp to go "on". The memory flip-flop 406 is accordingly set. This is indicated by the $Q_2$ output going to a binary 0 in event 6. Next consider event 7, where the cassette is erroneously returned to the same corner a second time. The $J_1$ signal now goes to a binary 1 and the AND gate 408 is enabled, causing the lamp 54 to become lit. At event number 8 where the cassette is now moved to a new position, the signal $J_1$ becomes a binary 0, and the warning and inhibit signal is removed. The ninth event where the system is reset and the indicator circuit is returned to normal.

Up to this point what has been considered is positioning of the cassette and energizing the X-ray generator in the event that predetermined position sensing interlock switches are properly activated. As noted earlier, there is also an oscillating grid, and a pair of radiographic masks included in the spot film device which are selectively positioned by the subject invention.

Referring now to FIG. 12, a control signal for energizing a solenoid valve actuator for the oscillating grid is provided by means of a transistor driver 412 which is coupled to the output of an AND gate 414 which receives one input from the NO GRID selector switch 48 located on the control panel 20 shown in FIG. 1B, and being coupled thereto by means of a logic inverter 416. The other input to the AND gate 414 is provided by either input to an OR gate 418, one of which is provided by the RAPID exposure switch 46 and the output of an AND gate 420, which receives signals indicative of a not-load ($\overline{\text{LOAD}}$) condition provided by the step 5 signal from terminal 248 (FIG. 6) and the Q output from the cassette carriage drive flip-flop 302 shown in FIG. 8. Thus the grid solenoid valve will be activated unless the sequence is a LOAD sequence or if the NO GRID switch 48 has been selected, whereupon the grid will remain parked when the cassette advances. Also if the RAPID switch 46 has been selected, the grid will not park between exposures.

Figure 13:
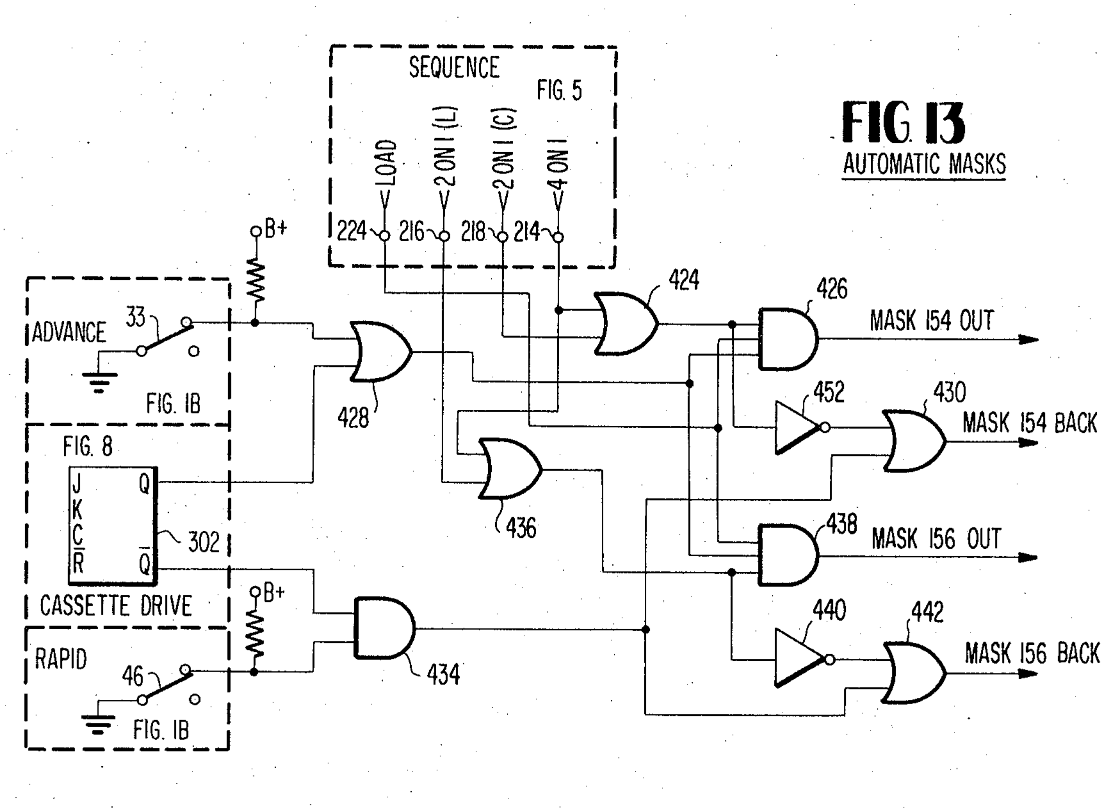
FIG. 13 is an electrical schematic diagram illustrative of the digital circuitry for controlling the radiographic mask actuators.

Considering now FIG. 13, there is disclosed digital logic circuitry for operating the radiographic masks 154 and 156 shown in FIGS. 3B and 3C. Each mask has a pair of binary control signals generated for individually moving each mask out and back between two positions. It is to be noted that the 4-on-1, 2-on-1(L), 2-on-1(C), and LOAD sequence signals are applied from FIG. 5 appearing on terminals 214, 216, 218 and 224, respectively. Additionally, binary input signals are applied from the ADVANCE switch 33 and the RAPID switch 46 on the control panel 30, in FIG. 1B, as well as a complementary Q and $\overline{Q}$ output from the cassette carriage drive flip-flop 302 in FIG. 8. The binary circuitry disclosed includes an OR gate 424 having inputs coupled from terminals 214 and 218 of FIG. 5 which feed into an AND gate 426 also receiving inputs from terminal 224 (FIG. 5) as well as the output from an OR gate 428 coupled to the ADVANCE switch 33 and the Q output of the cassette carriage drive flip-flop 302 (FIG. 8). The output of the AND gate 426 is adapted to provide a binary output which controls a solenoid operated valve for moving the mask 154 "out" i.e. toward the LOAD end of the spot film housing. The signal for operating a solenoid for moving the mask 154 "back" toward the PARK position is provided by an OR gate 430 having inputs applied from the OR gate 424 and a logic inverter 432 as well as an input from an AND gate 434 coupled to the $\overline{Q}$ output of the cassette carriage drive flip-flop 302 and the RAPID switch 46. The same circuitry is repeated for the mask 156 and includes an OR gate 436 an AND gate 438, logic inverter 440 and an output OR gate 442. Thus with any filming sequence selection with the exception of the 1-on-1 sequence, the masks will be driven to a proper alignment for exposing the proper portion of the X-ray film in conjunction with the cassette positioning.

Figure 14:
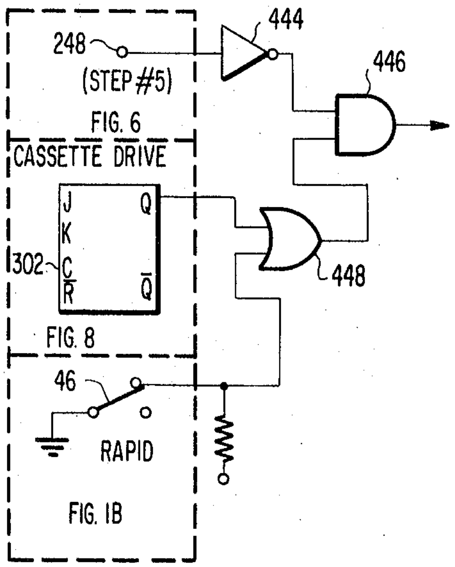
FIG. 14 is an electrical schematic diagram illustrative of the digital circuitry for providing cassette movement speed control in the longitudinal direction.

Finally, FIG. 14 is included to disclose a binary circuit for controlling a pneumatic pressure changer which is adapted to move the piston 102 of the cassette carriage drive cylinder 100 shown in FIG. 2A at a relatively higher speed in the forward longitudinal direction when the cassette is moving out from the park position and during the $\overline{\text{RAPID}}$ mode sequence. Accordingly, the not-load ($\overline{\text{LOAD}}$) signal is produced by means of a logic inverter 444 coupled back to step 5 signal terminal 248 shown in FIG. 5 which is then fed to an AND gate 446. The other input to the AND gate comprises the output from an OR gate 448 coupled to the Q output of the cassette carriage drive flip-flop 302 shown in FIG. 8, and the RAPID mode selector switch 46 shown in FIG. 1B. The control output from the AND gate 446 energizes means which for example controls a pressure regulator or valving means which momentarily increases input pressure to the cylinder.

What has been shown and described, therefore, is an improved spot-film device controlled by means of a solid state digital logic circuitry for operating pneumatic power actuators and stops in response to simple cassette position sensing interlock switches and control push-buttons. While the subject invention has been disclosed with regard to an embodiment utilizing positive logic, it should be pointed out that this disclosure has been made by way of illustration only and is not meant to be considered in a limiting sense. Accordingly, it is well known that when desirable the logic implementation when desirable can be effected by means of negative logic and/or inverse logic means including NOR and NAND logic elements, or any other type of digital logic.

Accordingly, having thus described what is at present considered to be the preferred embodiments of the subject invention, I claim:

1. An electronically controlled spot film device utilized in connection with diagnostic X-ray apparatus and being adapted to selectively control the motion and position of an X-ray cassette, the position of a radiographic grid, the selection of the correct positional combination of a pair of radiographic masks, the initiation of an X-ray exposure and activating an analog display of the exposed X-ray film areas, wherein the improvement comprises:

a spot film housing;

a rectilinearly movable assembly located in said housing and being adapted to support an X-ray film cassette;

binary digital electrical signal responsive assembly positioning means adapted to move said assembly independently in first, for example cross-shift, and second, for example longitudinal, mutually orthogonal directions within said housing and stop at selected locations in each direction in response to electronically generated binary digital electrical control signals applied thereto for moving said cassette into and out of one or more X-ray exposure positions in a predetermined sequence as well as loading and unloading said cassette from said housing;

assembly position sensing means selectively located in said housing and being operated in response to assembly motion and position, providing binary digital electrical signals indicative of the position at any point in time of said assembly in said housing;

operation mode selector means providing a predetermined binary digital electrical output signal when activated to select a desired operating sequence of a plurality of operating sequences of said spot film device; and an electronic control circuit including, a. a digital sequence binary signal generator circuit coupled to said operation mode selector means, being responsive to said electrical output signal from said selector means to program and generate binary signals corresponding to the selected sequence;

b. a binary electronic sequence counter circuit coupled to said sequence signal generator circuit and receiving said binary signals therefrom, additionally receiving a remotely generated indexing count pulse after each actual and skipped exposure as well as a reset pulse at the end of the selected sequence, providing as an output a predetermined number of sequential binary signals in accordance with the selected operating sequence;

c. a binary electronic position sequence logic circuit coupled to said sequence binary signal generator circuit and said binary electronic counter circuit and receiving selected binary output signals therefrom to generate predetermined electrical control signals coupled to said assembly positioning means for causing selective movement of said assembly in said first orthogonal direction and for causing selective stoppage of movement of said assembly in said second orthogonal direction; and d. binary electronic second orthogonal direction drive circuit means coupled both to said operation mode selector means and said assembly position sensing means, additionally receiving a reset signal after a selected sequence and being operable in response to binary signals from said drive circuit means and said position sensing means to generate a control signal coupled to said assembly positioning means for causing movement of said assembly in said second orthogonal direction limited to the selective stoppage effected by control signals from said position sequence logic circuit coupled to said assembly positioning means.

2. The spot film device as defined by claim 1 wherein said assembly position sensing means comprises a plurality of assembly operated electrical switches and said operation mode selector means comprises a plurality of manually operated electrical switches.

3. The spot film device as defined by claim 1 wherein said sequence binary signal generator, said sequence counter circuit, said position sequence logic circuit and said second orthogonal direction drive means each includes a plurality of interconnected integrated circuit binary logic modules.

4. The spot film device as defined by claim 1 wherein said exposure control circuit includes a plurality of interconnected integrated circuit logic modules.

5. The spot film device as defined by claim 1 wherein said rectilinearly movable assembly includes:

a cassette carriage movable in the longitudinal direction within said housing; and a cassette tray movably attached to said cassette carriage and adapted to transversely move independently of said carriage in the cross shift direction within said housing;

and wherein said assembly positioning means includes:

first drive means operated by at least one digital control signal from said second orthogonal direction drive circuit means and coupled to said carriage for providing motion along said longitudinal direction;

a plurality of carriage motion stops operated by respective digital control signals from said position sequence logic circuit and being operable to inhibit travel of said carriage at a respective plurality of predetermined longitudinal locations;

second drive means operated by at least one control signal from said position sequence logic circuit, coupled to said cassette tray for providing selective motion along said cross shift direction; and cross shift stop means operated by a control signal from said position sequence logic circuit for selectively inhibiting motion of said cassette tray in said cross shift direction.

6. The spot film device as defined by claim 5 wherein said first and second drive means and said carriage and cassette tray stop means comprises electrically controlling pneumatic actuator means.

7. The spot film device as defined by claim 5 wherein said cassette tray includes an extension member slidably engaging a guide rod extending in the longitudinal direction, said guide rod engaging a rack and pinion gear assembly which is adapted to provide cross shift motion of said guide rod and wherein said drive means for said cassette tray is coupled to said guide rod, and wherein said cross shift stop means comprises an electrically actuated piston adapted to abut said guide rod when actuated for inhibiting cross guide motion of the cassette tray to substantially the center position of the permissible cross guide travel.

8. The spot film device as defined by claim 1 and additionally including:

means for varying the speed of travel of said movable assembly in the longitudinal direction; and binary digital control circuit means coupled to said operation mode selector means, to said second orthogonal direction drive circuit and to said sequence counter circuit and being operable to generate a control signal coupled to said means for varying the speed of said movable assembly.

9. The spot film device as defined by claim 1 and additionally including a binary digital exposure control circuit coupled to said operation mode selector means and said assembly position sensing means being operable in response to control signals therefrom to actuate an X-ray generator to produce an exposure when said X-ray cassette is properly positioned within said housing as indicated by said position sensing means and said exposure initiating switch means is operated, and to inhibit the operation of the X-ray generator in the event that said cassette is improperly positioned as indicated by said position sensing means, and additionally generating said indexing count pulse applied to said counter circuit after each exposure and when a skip exposure is actuated and generating said reset pulse supplied to said drive circuit means.

10. The spot film device as defined by claim 9 wherein said assembly position sensing means comprises a plurality of switch means adapted to be operated by said movable assembly; and wherein the operation mode selector means comprises:

switch means for selecting a 4-on-1 filming sequence;

switch means for selecting a first type 2-on-1 filming sequence;

switch means for selecting a second type 2-on-1 filming sequence;

switch means for selecting a 1 -on-1 filming sequence;

switch means for selecting a cassette LOAD sequence;

switch means for selecting a RAPID exposure sequence;

switch means for causing said cassette carriage and tray to advance to an exposure position;

switch means operable to cause said cassette carriage and tray to move to a PARK position;

switch means for initiating an exposure; and switch means for skipping an exposure.

11. The spot film device as defined by claim 9 and additionally including:

exposure indicator means adapted to provide a visual indication of the exposed area of an X-ray film positioned in a cassette supported by said movable assembly; and a digital indicator driver circuit coupled to and receiving digital input signals from said position sequence logic circuit and said count pulse from said exposure control circuit for activating said indicator means and additionally receiving a reset pulse from said exposure control circuit for deenergizing said indicator means when a selected filming sequence is completed.

12. The spot film device as defined by claim 1 and additionally including:

a radiographic grid and actuator means therefor; and binary digital control circuit means coupled to said operation mode selector means, to said second orthogonal direction drive circuit means and to said sequence counter circuit for selectively energizing said grid actuator and positioning said grid within said housing during a selected operating sequence.

13. The spot film device as defined by claim 1 and additionally including:

a pair of independently movable radiographic masks and respective actuator means therefor; and binary digital control circuit means coupled to said operation mode selector means, to said sequence binary signal generator and to said second direction drive circuit means and being operable to selectively position said radiographic masks in said housing in accordance with a predetermined filming sequence.

* * * * *